(12) United States Patent
Strotmann et al.

(10) Patent No.: US 8,941,035 B2
(45) Date of Patent: Jan. 27, 2015

(54) SOLDERING METHOD

(75) Inventors: Guido Strotmann, Anröchte (DE);
Achim Froemelt, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 814 days.

(21) Appl. No.: 13/077,163

(22) Filed: Mar. 31, 2011

(65) Prior Publication Data

US 2012/0248094 A1 Oct. 4, 2012

(51) Int. Cl.
*B23K 1/002* (2006.01)
*B23K 1/00* (2006.01)
*B23K 1/008* (2006.01)

(52) U.S. Cl.
CPC ........... *B23K 1/0016* (2013.01); *B23K 1/008* (2013.01); *H01L 2224/32225* (2013.01); *H01L 2224/48091* (2013.01); *H01L 2224/48137* (2013.01); *H01L 2224/48227* (2013.01); *H01L 2224/73265* (2013.01); *H01L 2224/92247* (2013.01); *H01L 2924/19107* (2013.01)
USPC ........................... 219/616; 219/603; 219/85.1

(58) Field of Classification Search
CPC ........ B23K 3/047; B23K 1/008; B23K 1/012; B23K 2201/42; B23K 1/0016; B23K 1/002; B23K 13/01; B23K 2201/40; B23K 2201/36; H05K 2203/0152; H05K 2203/101; H05K 3/3494
USPC .................................. 219/615, 616, 617, 76.1
See application file for complete search history.

(56) References Cited

U.S. PATENT DOCUMENTS 4,180,199 A * 12/1979 O'Rourke et al. ............ 228/102
7,549,566 B2 * 6/2009 Nonomura et al. ........... 228/102
2008/0023530 A1 * 1/2008 Kemper ...................... 228/179.1

* cited by examiner

*Primary Examiner* — Tu B Hoang
*Assistant Examiner* — Diallo I Duniver
(74) *Attorney, Agent, or Firm* — Murphy, Bilak & Homiller, PLLC

(57) ABSTRACT

A soldering method is provided. According to the method at least two sets of components are heated and soldered by heating. Each set includes a first soldering partner, a second soldering partner, and a solder. During the soldering process, the individual temperatures of each one of the sets are transmitted by a radio frequency transmitter to a receiving and control unit. The control unit controls the heating of the sets depending on the transmitted individual temperatures.

24 Claims, 14 Drawing Sheets

SOLDERING METHOD

BACKGROUND

In soldering processes, in which a number of units are soldered, the quality of the soldered connections produced between two soldering partners is difficult to control. For example, if the soldering of many units takes place in a conventional soldering furnace, the quality of the solder connections may vary due to a non-uniform heat distribution in the furnace, or due to different heat capacities of the soldering partners.

SUMMARY

A soldering method is provided, in which a soldering machine is equipped with at least one heating chamber. The heating chamber includes a heating unit operable to provide energy. In the method, at least two sets of components are soldered. Each one of the sets has a first soldering partner, a second soldering partner, and a solder. For soldering, each one of the sets is positioned inside the heating chamber. Each set has a solder layer, e.g. a preform solder, which is arranged between the first soldering partner and the second soldering partner of the respective set.

In addition, for each one of the sets, a temperature measuring unit is provided which is assigned to the respective set. Also provided are a radio frequency transmitter, a receiving unit, and a control unit. The control unit is coupled to the receiving unit and operable to control the heating unit. Each one of the temperature measuring units is thermally coupled to the respective soldering partner.

During the process, for each one of the temperature measuring units the radio frequency (RF) transmitter is operable to transmit temperature information on the temperature of the respective temperature measuring unit to the receiving unit. For pre-heating or soldering, the sets of components are heated by the energy provided by the heating unit. The energy provided by the heating unit is controlled by controlling the heating unit using the control unit depending on the temperature information. That is, the heating unit is controlled by the control unit in such a manner that the energy which is generated by the heating unit for pre-heating or soldering depends on the instant temperatures of the individual sets. Thus temperature profiles can be controlled and measured during the whole soldering cycle and cycle in the furnace.

According to one aspect, the soldering may at least partially take place in a vacuum, for instance at pressures below 20 hPa, in a reducing atmosphere. The reducing atmosphere may include one or more of hydrogen, formic acid, and one or more other deoxidizing gases. The embodiments described herein allow for the control of the temperature profiles of the sets throughout the whole cycle during which the sets are treated in the furnace. This particularly applies if the furnace exhibits two or more chambers through which the sets run through in order to achieve different treatments while moving from chamber to chamber. So as to achieve this target, the carriers carrying the sets are equipped with temperature measuring and transmitting electronics that move with the carriers and permit a continuous acquisition of the temperature profile of each set, and a continuous control of the soldering process during the full treatment of the set in the furnace. In particular, at any certain point of time, the control of the remaining soldering process may depend on the temperature profiles of the sets acquired from the beginning of the soldering process until the certain point of time.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the Figs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
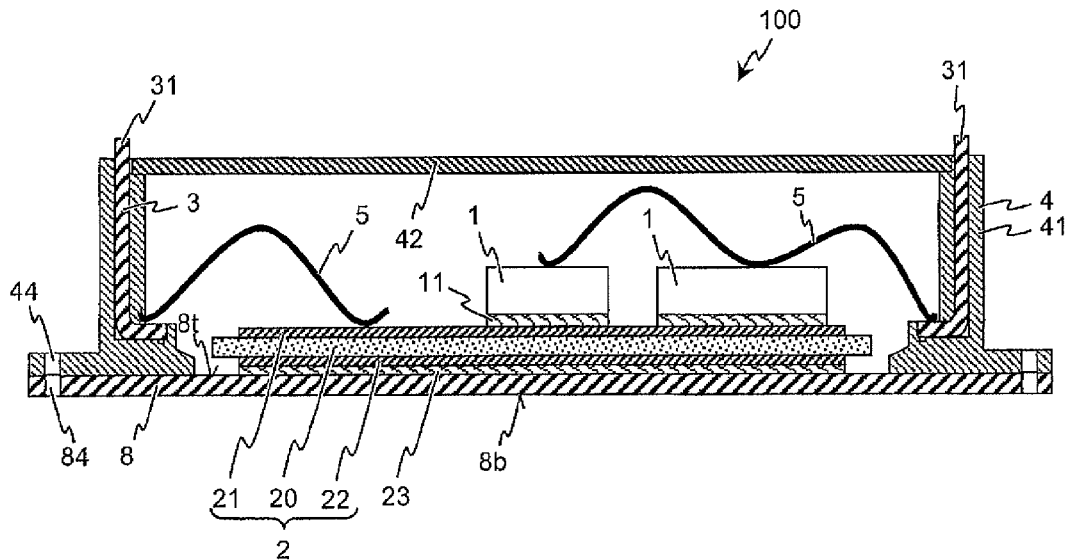
FIG. 1A is a cross-sectional view of a power semiconductor module.

Referring now to FIG. 1A there is illustrated one embodiment of a power semiconductor module 100. The power semiconductor module 100 includes a flat base plate 8 with a top side 8t and a bottom side 8b. Together with a cast housing 4 having side walls 41 and an optional housing cover 42, the base plate 8 forms a housing of the power semiconductor module 100. In addition, the bottom side 8b of the base plate 8 is part of the bottom side of the module 100.

The module 100 contains at least one substrate 2. Each substrate 2 includes a dielectric insulation carrier 20 which is provided with a top metallization 21 and with an optional bottom metallization 22. For instance, the top metallization 21 may have a thickness ranging from 0.1 mm to 0.6 mm. The insulation carrier 20 serves to electrically insulate the top metallization 21 from the base plate 8.

On the substrate 2, one or more power semiconductor chips 1 are arranged. In the embodiment of FIG. 1, each of the power semiconductor chips 1 may include a controllable power semiconductor switch, e.g., an IGBT (insulated gate bipolar transistor), a MOSFET (metal oxide semiconductor field effect transistor), a J-FET (junction field effect transistor), or a thyristor, or a diode. However, in other examples of a power semiconductor module, the number and type of waste heat producing power semiconductor chips 1 arranged on the substrate 2 is arbitrary.

In FIG. 1A, the power semiconductor chips 1 are mounted and electrically connected to the top side metallization 21 by a connection layer 11, for instance a solder layer, a diffusion solder layer with a significant amount of inter-metallic phases, an electrically conductive glue, or a sintered layer.

The top sides of the semiconductor chips 1 may be electrically connected, e.g., by bonding, electrically conductive gluing, sintering, or by pressure contact. In the embodiment of FIG. 1A, a number of bonding wires 5, which connect respective components of the module 100, are provided. Instead of bonding wires 5, the top sides of the power semiconductor chips 1 may be electrically connected by clips which may be soldered, diffusion soldered, sintered, or pressure contacted to a top side contact of the respective power semiconductor chip 1.

In order to allow for a sufficient cooling of the power semiconductor chips 1, a low heat transmission resistance is an important property of the dielectric layer 20. Hence, the material and the thickness of the dielectric layer 20 needs to be adapted to the requirements of the power semiconductor module 100. For example, the insulation carrier 20 may be a ceramic so that the substrate 2 forms a ceramic substrate. For instance, the insulation carrier 20 may include or consist of one the following materials: aluminum oxide ($Al_2O_3$); aluminum nitride (AlN); silicon nitride ($Si_3N_4$). Then, for instance, the thickness of one, some or all of such ceramic substrates may range from 0.2 mm to 2 mm.

In some embodiments, at least one of the substrates 2 may be a direct copper bonding substrate (DCB substrate), or a direct aluminum bonding substrate (DAB substrate), or an active metal brazing substrate (AMB substrate).

The base plate 8 may comprise or consist of an electrically conductive metal plate (e.g., made of copper or of aluminum) which optionally may be provided on its surface with a thin layer of a material, e.g. nickel, which improves the solderability of the base plate 8.

Generally, a power semiconductor module 100 includes a number of connection lugs 3 with terminals 31 which allow for electrically connecting the module 100 to other components such as power supply units, DC link capacitors, electric machines, other power semiconductor modules, and/or to a control unit. Inside the module housing 4, the connection lugs 3 are electrically connected to the top metallization 21 and/or to one or more of the power semiconductor chips 1. In the embodiment of FIG. 1A, the respective electrical connections are realized by bonding wires 5. However, other connection techniques are also appropriate.

In order to mount the bottom side 8b of the module 100 on a heat sink (not shown), the base plate 8 and the module housing 4 may have screw holes 84 and 44, respectively.

Optionally, the interior of the housing 4 may be filled with an insulating soft potting material (not shown), e.g., a silicone gel, which extends from the base plate 8 and covers at least the top metallization 21 and the power semiconductor chips 1 in order to improve the dielectric strength of the module 100.

The area of the bottom side of the bottom metallization 22, that is, the side of the bottom metallization 22 facing toward the base plate 8, may for instance be greater than or equal to 0.2 mm which is large compared with respect to areas of conventional electronic components. Therefore, soldering a substrate 2 to a base plate 8 is sophisticated. For instance, if shrinkage holes occur in the solder layer 23, the electrical and thermal contact between the substrate 2 and the power semiconductor chips 1 is poor, and the dissipation of the waste heat produced in the power semiconductor chips 1 toward the base plate 8 is not appropriate.

In order to improve the quality of soldered connections, a method is provided which enables the monitoring of individual temperatures of a number of components to be soldered during both a heating step and/or a subsequent cooling step. This method allows for permanently monitoring the instant temperature of each unit which is produced by soldering. There is no need to use dummy units for the temperature measurement. Owing to knowledge of the instant temperatures of all units at any time, the heating temperature and/or the cooling temperature may be controlled depending on the temperatures.

In order to produce a power semiconductor module 100 as explained with reference to FIG. 1A, the unit comprising the base plate 8, the solder 23, the substrate 2, the solder 11 and the power semiconductor chips 1 may be produced by soldering the connection between the substrate 2 and the base plate 8 in a first step and by mounting this pre-assembled unit to the module housing 4 in a subsequent second step. In the soldering process of the first step, a number of similar or identical units may be pre-assembled by soldering these units at the same time.

Figure 1B:
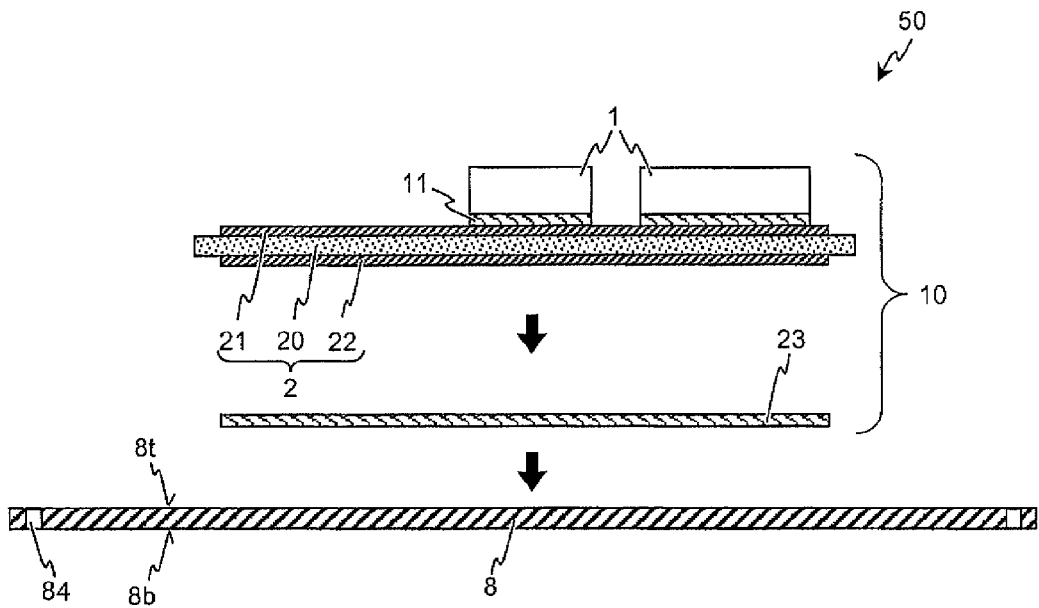
FIG. 1B shows a set of components to be soldered as used in the power semiconductor module of FIG. 1A.

For each unit to be produced, a set 50 of components 8, 10 and 23 as shown in FIG. 1B is provided. The set 50 includes a first soldering partner 8, a second soldering partner 10, and a solder 23. In the present example, the first soldering partner is the base plate 8. The second soldering partner 10 is the substrate 2 equipped with one or more power semiconductor chips 1 soldered to the substrate 2 by the connection layer 11. The melting point of the connection layer 11 may be higher than the melting point of the solder 23 so as to avoid a re-melting or other degradation of the connection layer 11 during the subsequent soldering process. According to another embodiment, the first soldering partner may be a semiconductor chip 1 and the second soldering partner may be the substrate 2 to which the semiconductor chip 1 is to be soldered. According to still another embodiment, a set 50 or each of the sets 50 may include more than one soldering partners. For instance, the solder connection 11 between a semiconductor chip 1 and a substrate 2 and the solder connection 23 between the same substrate 2 and the base plate 8 may be produced by soldering during the same soldering step, i.e. there are three soldering partners: the semiconductor chip 1; the substrate 2; and the base plate 8.

Compared with conventional solder connections, the solders 11 and 23 extend over a large area. For instance, the solder 11 may exhibit a foot print of at least 25 mm$^2$ and the solder 23 a foot print of at least 400 mm$^2$. Therefore, producing the respective soldered connections 11 and 23 is challenging. For example, there is a danger of shrink holes that may appear in the solder 11, 23 after the soldering is completed. Shrink holes may harmfully affect the electrical and thermal connection between the respective soldering partners.

The power semiconductor module of FIG. 1A is just an illustrative embodiment of a power semiconductor module. Other embodiments may exhibit different details. For instance, instead of a thick base plate 8, a substrate 2 with two or more metallization layers 21, 22 and one or more insulation carriers 20 may serve as a base plate, i.e. the bottommost metallization layer 22 of such a substrate 2 forms an outer face of the power semiconductor module.

Figure 2:
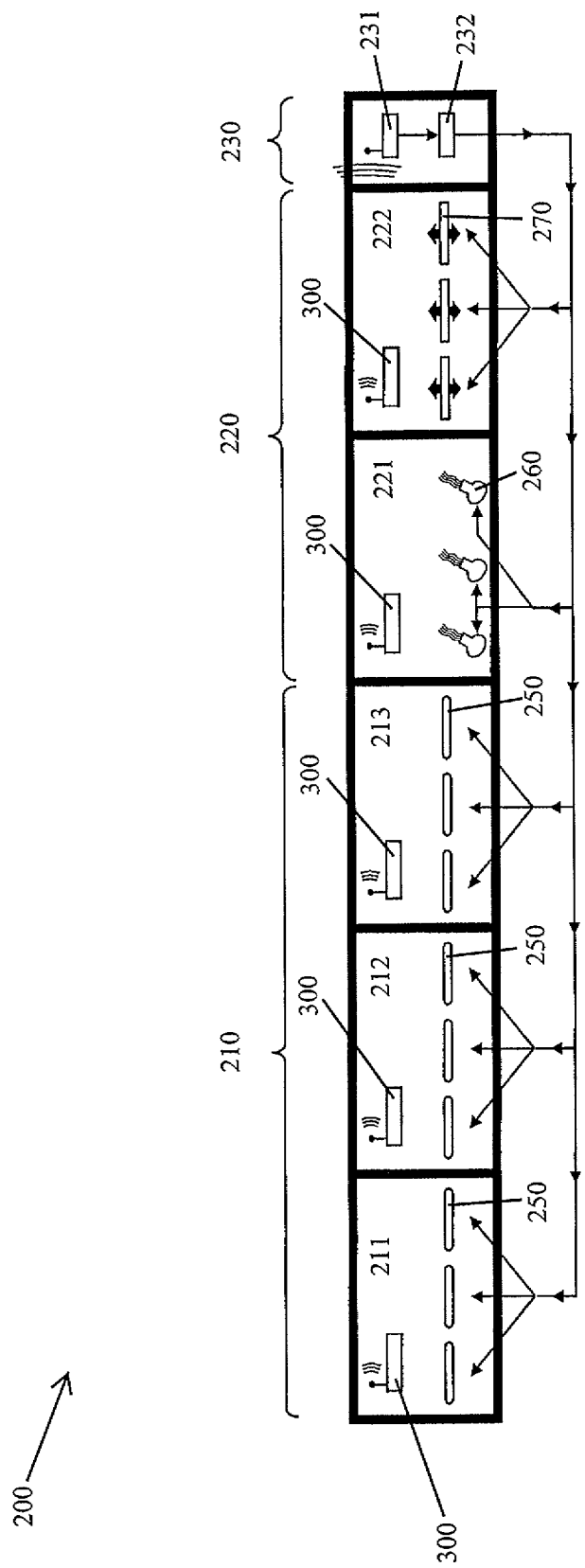
FIG. 2 is a cross-sectional view of a soldering furnace.

FIG. 2 illustrates a soldering machine 200 with a heating section 210, a cooling section 220, and a receiving and control means 230. The soldering machine 200 may be used for the soldering in particular of a number of sets 50 as mentioned above at the same time. In the following, a soldering process using a soldering machine exhibiting the same or similar features as the described soldering machine 200, will be described in which a number of sets 50 are soldered at the same time. Exemplary, the sets 50 are sets as explained with reference to FIG. 1B. However, other sets may be soldered in the same way. In the heating section 210 of the soldering machine 200, there is at least one heating chamber 211, 212, 213 and in the cooling section 220 there is at least one cooling chamber 221, 222. The heating chamber 211, 212, 213 may be used for pre-heating the sets 50 or for melting the solder 23 of the sets 50. After the solder 23 of all sets has been melted, cooling of the sets 50 may take place in the one or more cooling-chambers 221, 222.

For instance, in the soldering machine 200 there may be one to three heating chambers 211, 212, 213 and one or two cooling chambers 221, 222. In each heating chamber 211, 212, 213 there is a heating means 250 which serves for pre-heating the sets 50 and/or for melting the solders 23 of the sets 50. In one example, a heating means 250 may include one or more inductors. Accordingly, in each cooling chamber 221, 222 there is a cooling means 260, 270. By way of example, the cooling chamber 221 includes a cooling means 260 which provides one or more stream of cooling fluid, for instance air or another gas. As a further example, the cooling chamber 222 includes a cooling means 270 which includes a number of cooling plates.

Both the heating means 250 and the cooling means 260, 270 may be controlled by means of a controller 232 so as to adapt the required intensity of heating and/or cooling, respectively, dependent on the individual temperatures of all sets 50.

The basis for controlling the heating means 250 and the cooling means 260, 270 is the transmission of the temperatures of at least two or ideally of all sets 50 to the control unit 232 which is part of the receiving and control means 230. More precisely, the transmission of the temperatures takes place by the transmission of signals which correspond to the temperatures. As is illustrated in FIG. 2, these signals may be radio frequency (RF) signals which are transmitted via a radio frequency (RF) transmitter means 300 and received by a receiving unit 231. The control unit 232 which is coupled to the receiving unit 231 evaluates the temperature information contained in the radio frequency (RF) signal received by the receiving unit 231 and controls the heating means 250 and/or the cooling means 260, 270 depending on the temperature information.

Figure 3A:
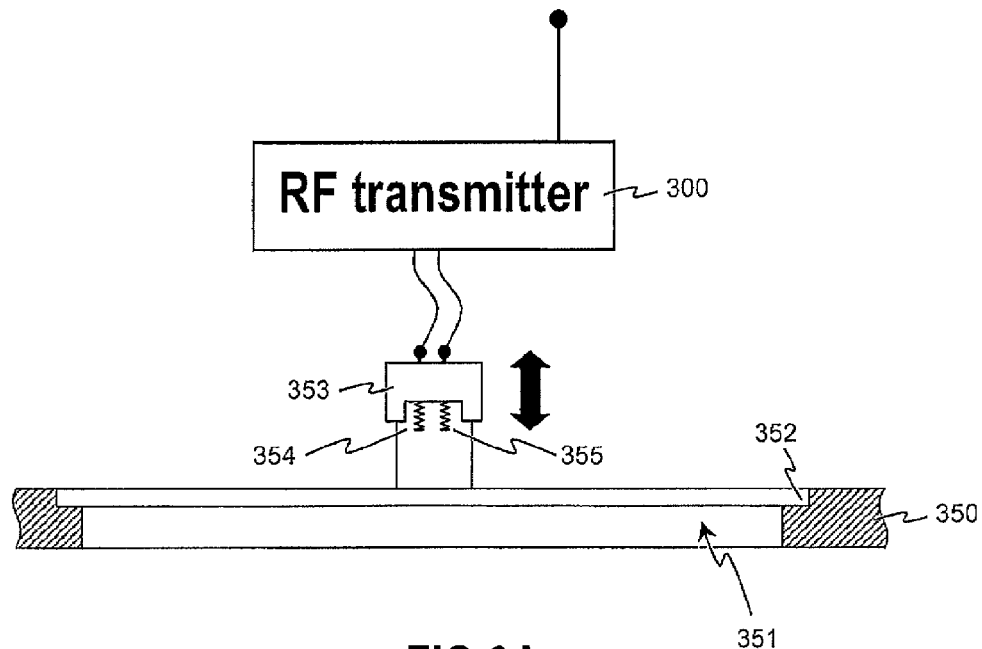
FIG. 3A illustrates a section of a carrier which is designed to receive a set of components to be soldered.
Figure 3B:
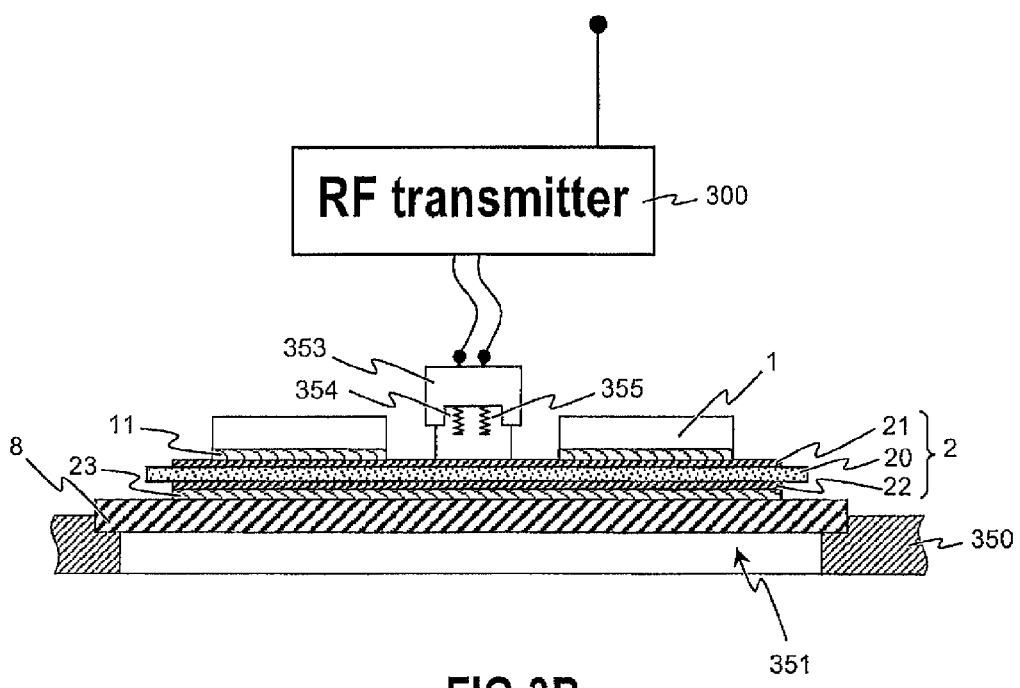
FIG. 3B shows the section of the carrier of FIG. 3A in which a set of components to be soldered is inserted.

FIG. 3A illustrates a section of a carrier 350 which is designed to receive several sets 50 as explained in detail with reference to FIG. 1B. The carrier 350 contains an opening 351 and a step 352 which is adapted to receive a single set 50 as shown in FIG. 1B. As can be seen from FIG. 3B, the set 50 with the solder 23 arranged between the first soldering partner (in the present example base plate 8) and the second soldering partner 10 (in the present example the substrate 2 carrying the semiconductor chips 1 soldered to it) is positioned above the opening 351. Until then there is no soldered connection between the substrate 2 and the base plate 8.

Figure 3C:
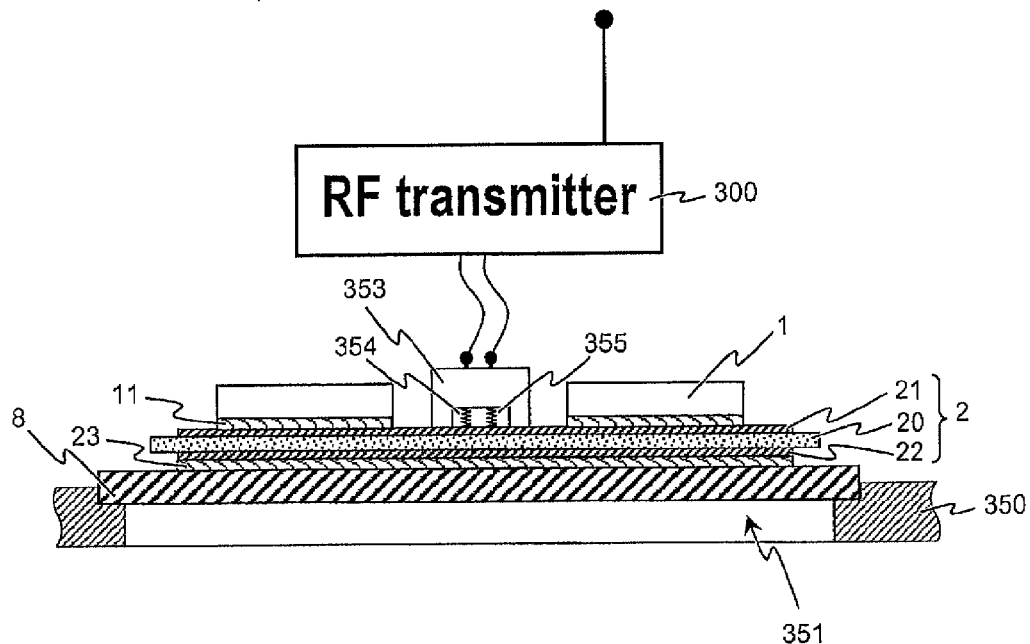
FIG. 3C shows the section of the carrier of FIG. 3B with one of the components of the set clamped to the carrier.

After moving a clamp 353 downwardly toward the carrier 350, the set 50 is held by the clamp 353 within the step 352 as shown in FIG. 3C. The clamp 353 may exert a pressure on the top side 8t of the base plate 8 or on the top side of the substrate 2.

Integrated in the clamp 353 are an electrically conductive first contact member 354 and an electrically conductive second contact member 355 which electrically contact the top side 8t of the base plate 8 or the top metallization 21 of the substrate 2.

According to one embodiment, the first contact member 354 and the second contact member 355 are made of different material which result, as soon as both contact members 354, 355 make electrical contact with the same electrically conducive part, in a first contact potential difference between the first contact member 354 and the electrically conductive part, and a second contact potential difference between the second contact member 355 and the electrically conductive part. For instance, the electrically conductive part may be the base plate 8, the top metallization 21 of the substrate 2, or a top metallization of one of the power semiconductor chips 1. The difference between the first contact potential difference and the second contact potential difference is a measure for the temperature of the electrically conductive part.

According to another embodiment, the first contact member 354 and the second contact member 355 may but are not do not necessarily required to be made of different material. In this example, both contact members 354, 355 make electrical contact with terminals of a temperature sensor element which is thermally coupled to a certain location of the set 50.

Figure 3D:
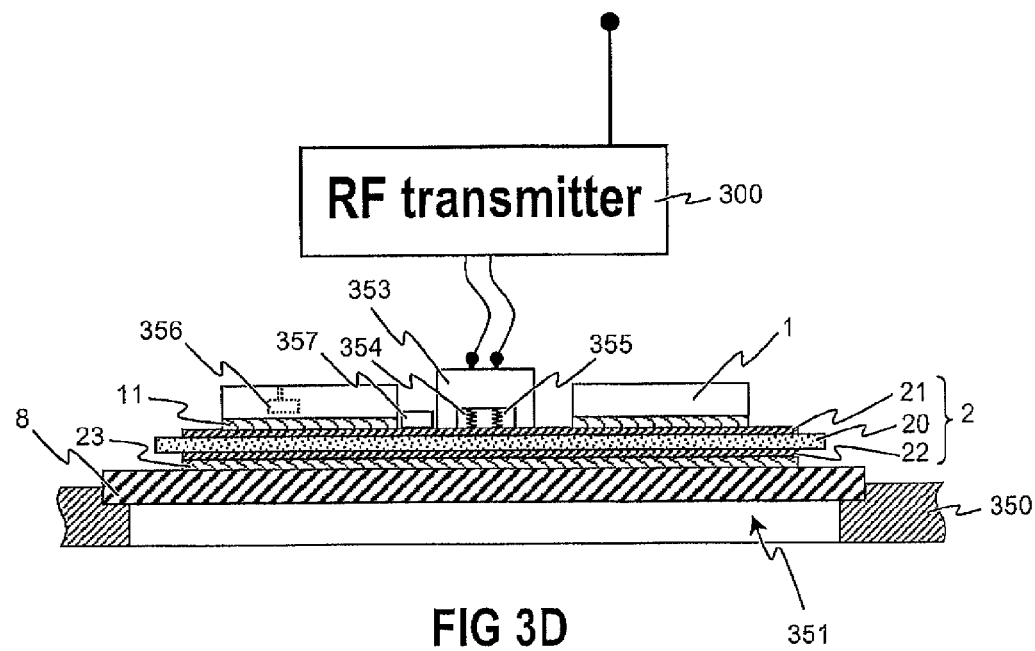
FIG. 3D shows the section of the carrier of FIG. 3C with a temperature sensor element integrated in a power semiconductor chip and with another temperature sensor element arranged on the substrate.

As shown in FIG. 3D, a temperature sensor element 356 may be integrated in a power semiconductor chip 1 and/or, a temperature sensor element 357 attached to the substrate 2 or the base plate 8. In doing so, the contact members 354, 355 can tap a signal provided by the respective sensor element 356 or 357. A part of the electrical connections between the terminals of the temperature sensor elements 356, 357 and the contact members 354, 355 may be realized with conductive lines formed in the top metallization 21 of the substrate 2. For instance, the sensor element 356 may be a diode, the sensor element 357 can be any arbitrary temperature element like a NTC-resistor (NTC=negative temperature coefficient), a PTC-resistor (PTC=positive temperature coefficient), a thermocouple etc.

Figure 4A:
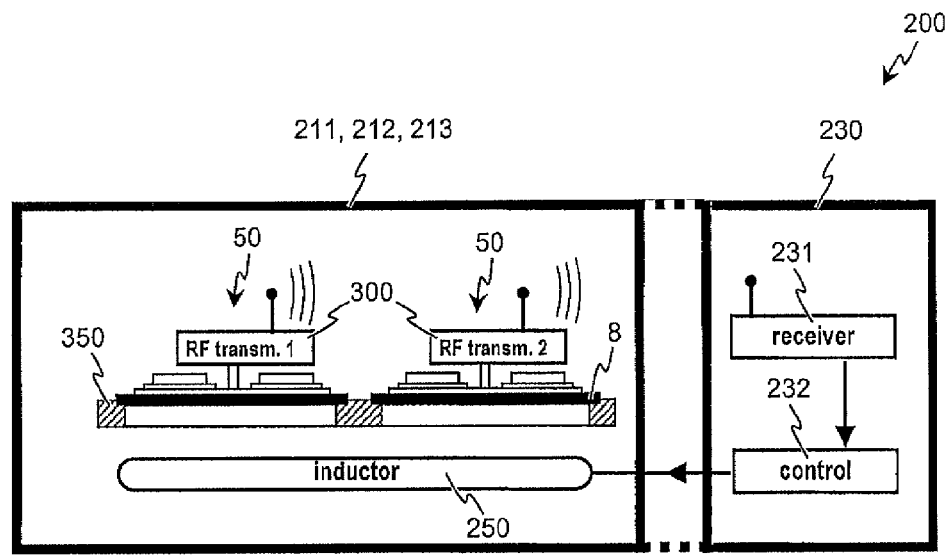
FIG. 4A is a cross-sectional view of a heating chamber and a control unit of a soldering furnace, where each of two sets of components to be soldered is provided with an individual radio frequency (RF) transmitter, and the two sets are heated by a common inductor.

FIG. 4A is a cross-sectional view of parts of a soldering machine 200 which exemplary shows a heating chamber 211, 212, 213 and the receiving and control means 230. At least one cooling chamber is present, but not shown for ease of illustration. On the carrier 350 there are arranged two sets 50 as described with reference to FIGS. 3A to 3D. Underneath the carrier 350 there is a heating means 250 which is a single inductor. The inductor may be designed like a coil with one or more windings. If the inductor is connected to an alternating current, an electromagnetic field occurs and causes eddy currents in the base plates 8 (illustrated black) which results in a temperature rise of the base plate 8, the solder 23, and the substrate equipped with the power semiconductor chips 1 (see FIGS. 3B to 3D). To each one of the sets 50, a radio frequency (RF) transmitter 300 is assigned. Each of the radio frequency (RF) transmitters 300 transmits a signal that contains information about the temperature of the respective set 50 to the common receiving unit 231. Subsequently, the control unit 232 evaluates the temperature information of both sets 50 and maintains, reduces or increases the intensity of the alternating current depending on the temperature information.

Figure 4B:
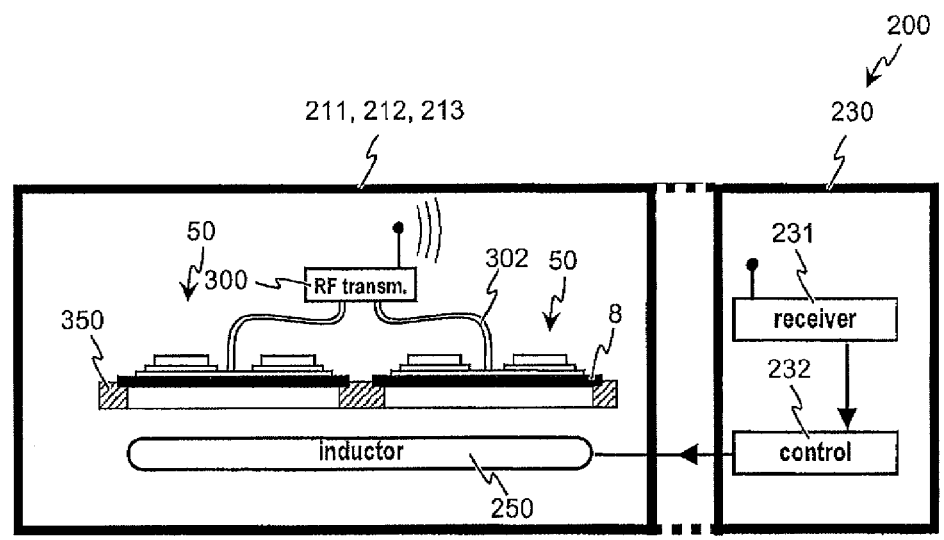
FIG. 4B is a cross-sectional view of a heating chamber which differs from the heating chamber of FIG. 4B in that the two sets of components to be soldered are provided with a common radio frequency (RF) transmitter instead of individual radio frequency (RF) transmitters.

The arrangement of FIG. 4B differs from the arrangement of FIG. 4A in that there is a common radio frequency (RF) transmitter 300 which transmits the temperature information of both sets 50.

Figure 5A:
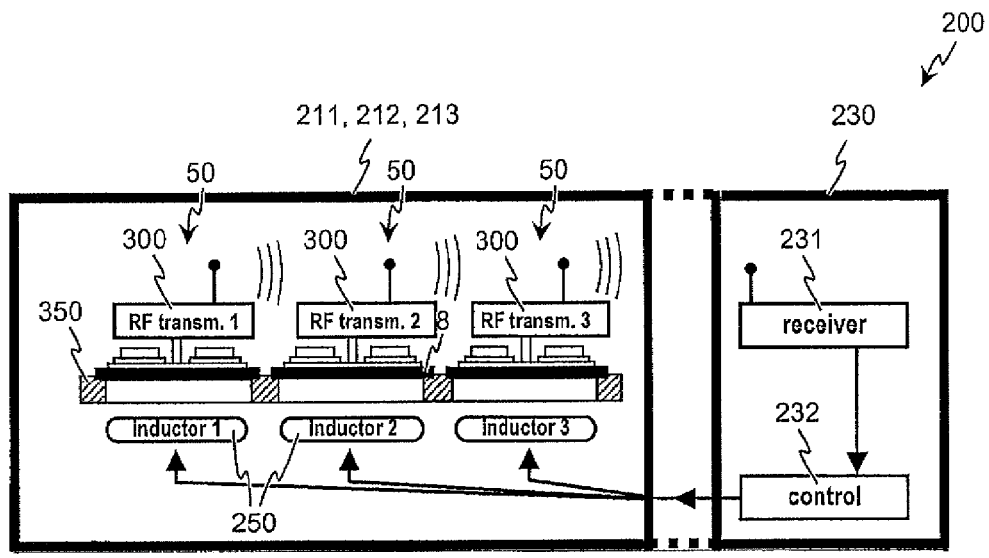
FIG. 5A is a cross-sectional view of a heating chamber and a control unit of a soldering furnace, where each of three sets of components to be soldered is provided with an individual radio frequency (RF) transmitter and heating means.

FIG. 5A is a cross-sectional view of parts of a soldering machine 200 which exemplary shows a heating chamber 211, 212, 213 and the receiving and control means 230. At least one cooling chamber is present, but not shown for ease of illustration. On the carrier 350 there are arranged three sets 50 as described with reference to FIGS. 3A to 3D. As in the arrangement of FIG. 4A, the temperature information of each set 50 is individually transmitted by different radio frequency (RF) transmitters 300 to the common receiving unit 231 and evaluated by the control unit 232.

Underneath the carrier 350 there is a heating means 250 with at least two inductors 250. Each of the inductors 250 may be designed like a coil with one or more windings. Each of the inductors 250 is arranged underneath one and only one of the sets 50 so that if the respective inductor is provided with an alternating current, a temperature rise only of the respective set 50 is caused (stray effects are not significant and may be neglected). Hence, the different inductors 250 may be controlled individually depending on the temperature information that is related to the corresponding set 50 which is arranged above the respective inductor. That is, the heating of the sets 50 may be controlled individually and therefore individually be adapted to certain requirements of the soldering process.

Figure 5B:
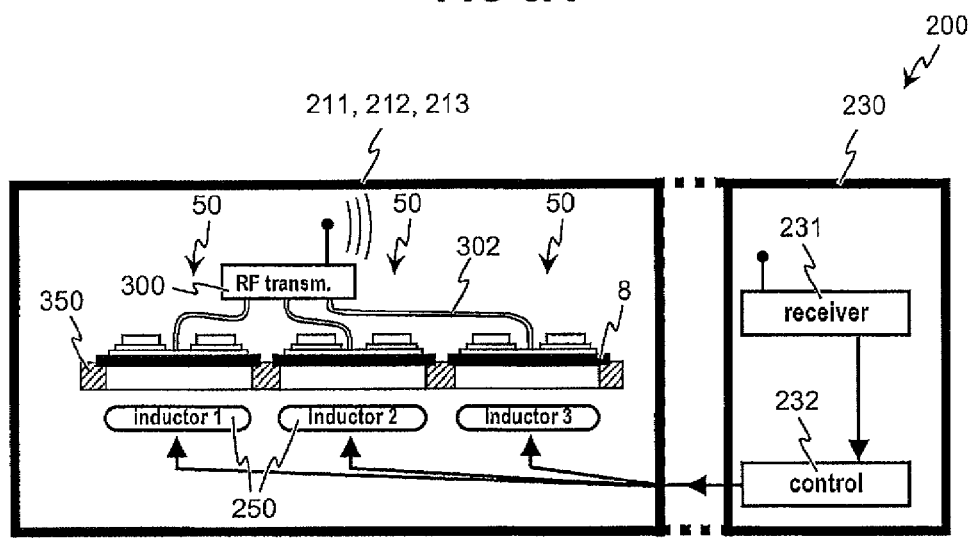
FIG. 5B is a cross-sectional view of a heating chamber which differs from the heating chamber of FIG. 5A in that the three sets of components to be soldered are provided with a common radio frequency (RF) transmitter instead of individual radio frequency (RF) transmitters.

The arrangement of FIG. 5B differs from the arrangement of FIG. 5A in that there is a common radio frequency (RF) transmitter 300 which transmits the temperature information of all sets 50 in the heating chamber 211, 212, 213.

Figure 6A:
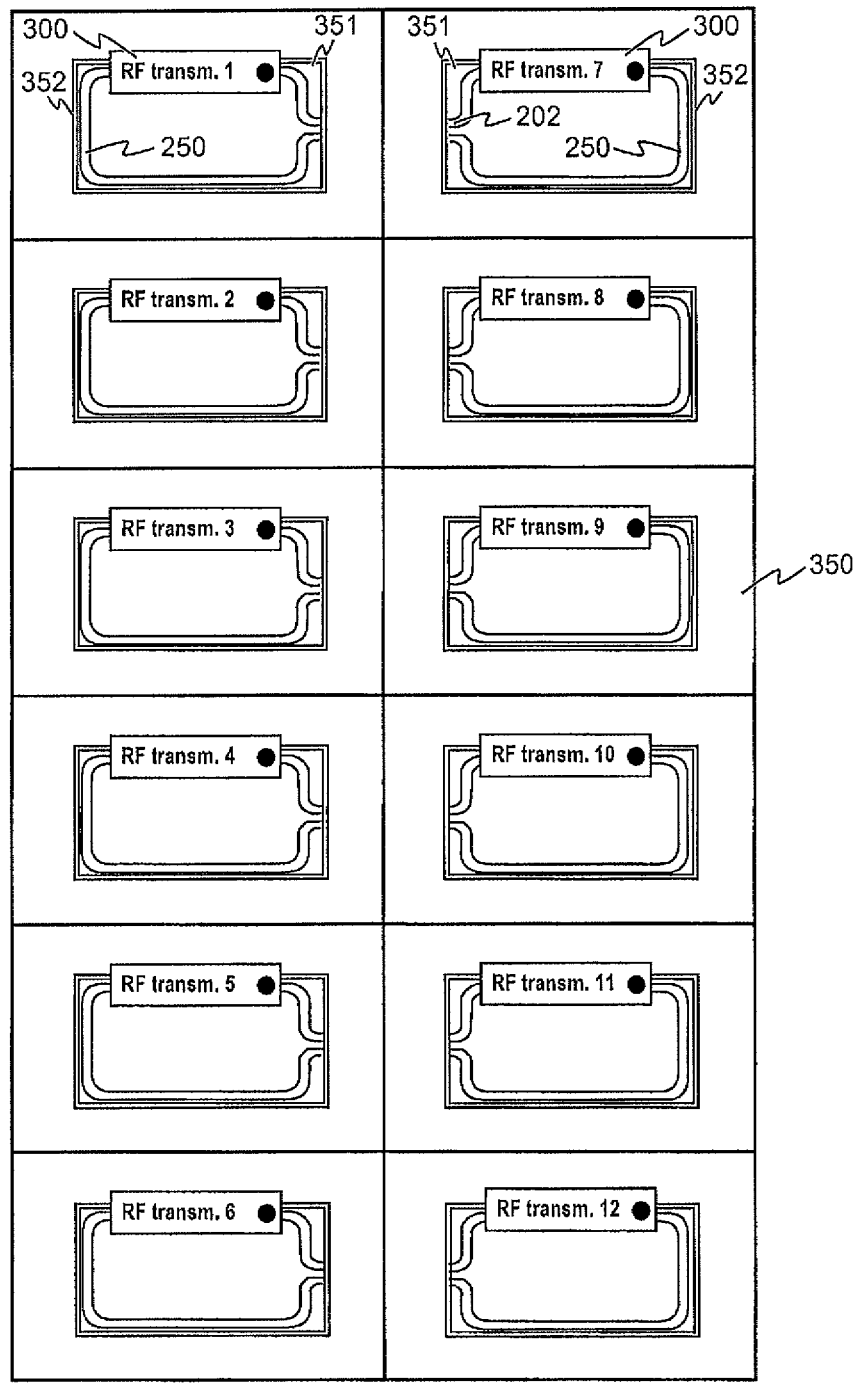
FIG. 6A is a top view of a carrier which is arranged in a soldering furnace and has a number of openings, where each of the openings is designed to receive a set of components to be soldered, and for each of the openings an individual radio frequency (RE) transmitter is provided.

FIG. 6A is a top view of a carrier 350 which is arranged in a soldering furnace and which has a number of openings 351. Each of the openings 351 is designed to receive a set of components to be soldered. For each of the openings 351, that is, for each of the sets to be inserted in the openings 351, an individual radio frequency (RF) transmitter 300 is provided. After being loaded with a number of sets, the carrier 350 can be moved between different heating and cooling chambers without interrupting the radio frequency (RF) transmission of the temperature information about the sets. As there is no set inserted in the carrier 350, the inductors underneath the openings of the carrier 350, each of which individually being assigned to one and only one of the openings 351, are visible.

Figure 6B:
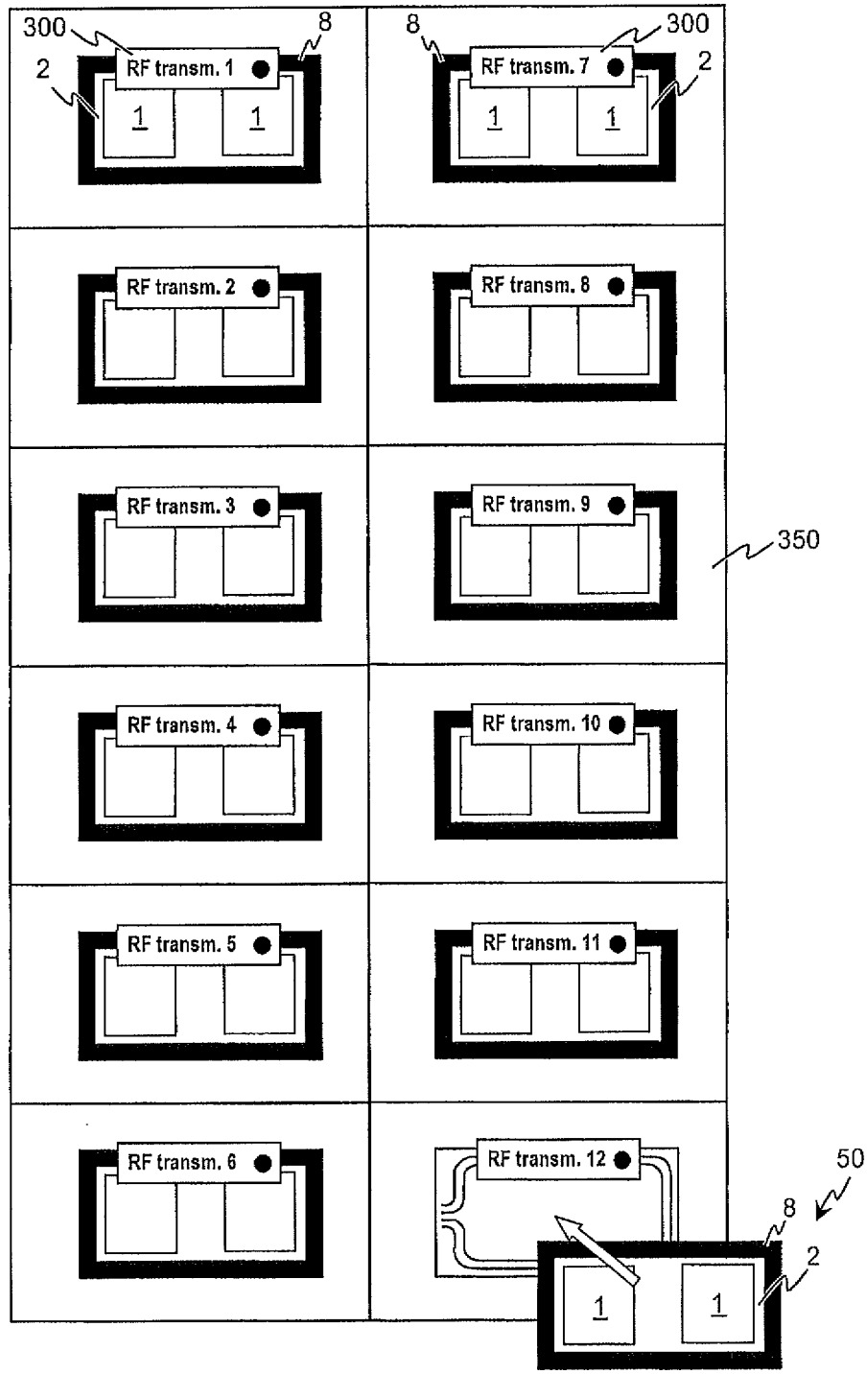
FIG. 6B shows the carrier of FIG. 6A with the openings being equipped with sets of components to be soldered.

FIG. 6B shows the carrier of FIG. 6A with the openings 351 being loaded with sets as described with reference to FIGS. 3A to 3D.

Figure 7A:
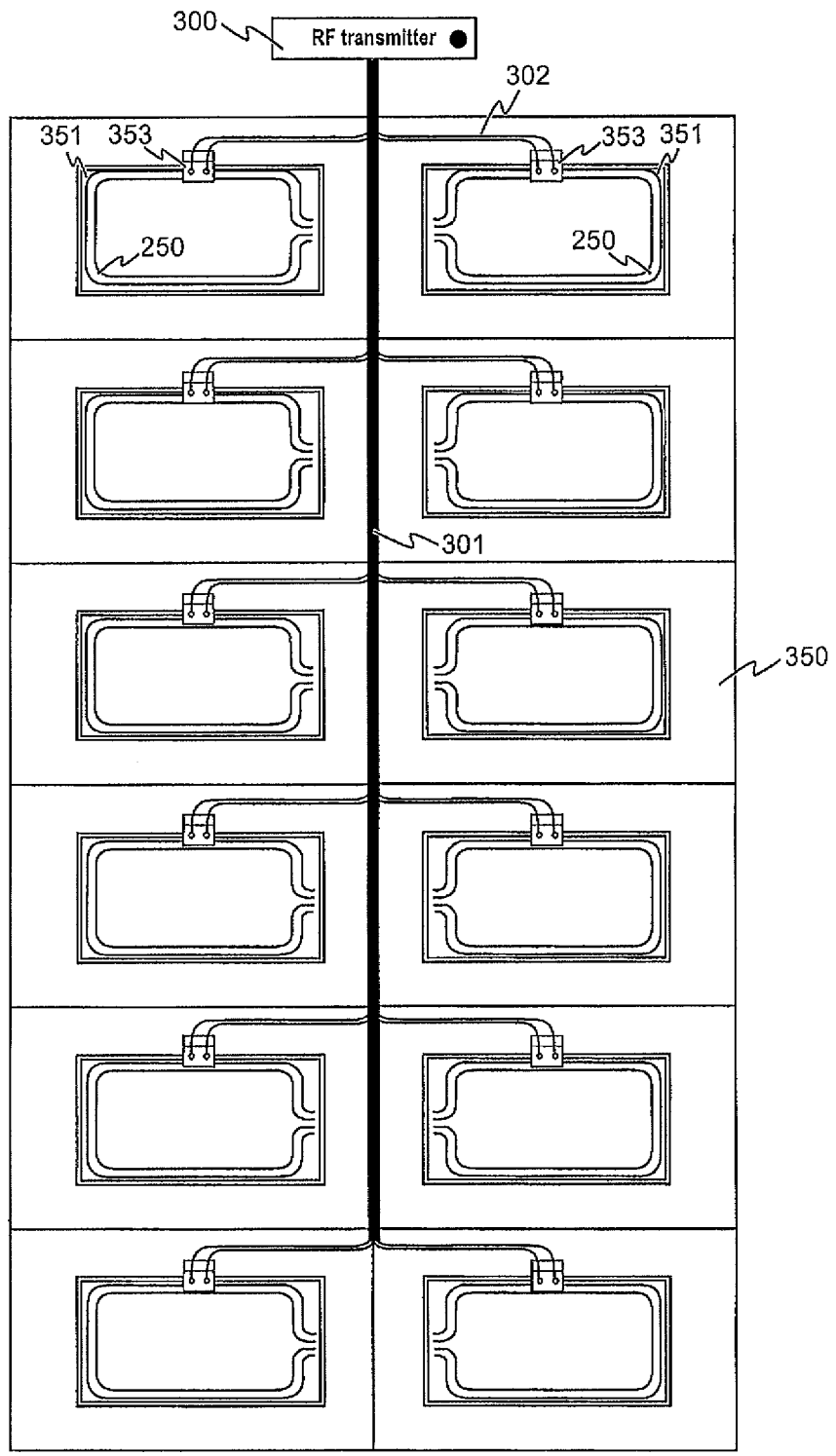
FIG. 7A is a top view of a carrier which is arranged in a soldering furnace and has a number of openings, where each of the openings is designed to receive a set of components to be soldered, and a common radio frequency transmitter for commonly transmitting the temperatures of different sets is provided.

The carrier 350 shown in FIG. 7A differs from the carrier of FIG. 6A in that there is only one radio frequency (RF) transmitter 300 instead of a number of radio frequency (RF) transmitters. In each of the clamps 353 a first and second contact member is integrated as described with reference to FIGS. 3A to 3D. All first and second contact members are electrically connected to the same radio frequency (RF) transmitter 300 by electrical lines 302, 301.

Figure 7B:
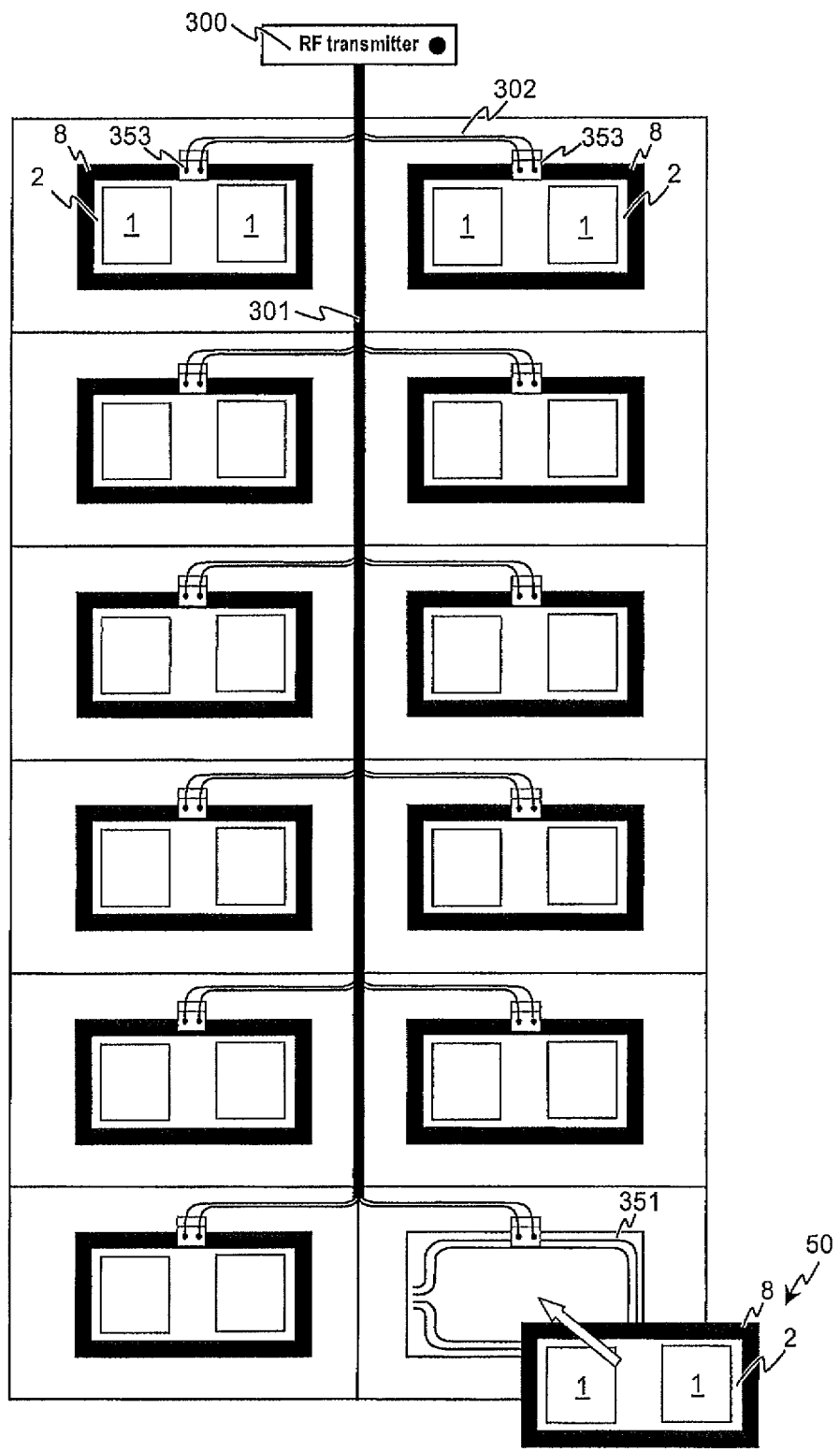
FIG. 7B shows the carrier of FIG. 7A with the openings being equipped with sets of components to be soldered.

FIG. 7B shows the carrier of FIG. 7A with the openings 351 being loaded with sets as described with reference to FIGS. 3A to 3D. The radio frequency (RF) transmitter 300 commonly transmits the individual temperature information of all sets 50 to a common receiving unit 231.

Figure 8A:
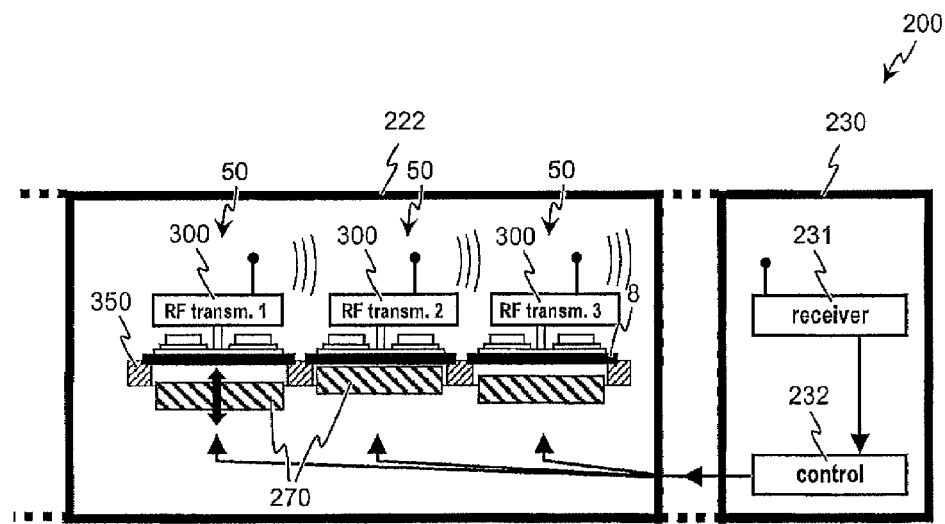
FIG. 8A is a cross-sectional view of a cooling chamber and a control unit of a soldering furnace, where each of three sets of components to be soldered is provided with an individual radio frequency (RF) transmitter and with an individual cooling plate.

FIG. 8A is a cross-sectional view of parts of a soldering machine 200 which exemplary shows a cooling chamber 221, 222 and the receiving and control means 230. At least one heating chamber is present, but not shown for ease of illustration. On the carrier 350 there are arranged three sets 50 as described with reference to FIGS. 3A to 3D. As in the arrangements of FIGS. 4A, 5A and 6B, the temperature information of each set 50 is individually transmitted by different radio frequency (RF) transmitters 300 to the common receiving unit 231 and evaluated by the control unit 232.

Underneath the carrier 350 there is a cooling means 270 which includes a number of cooling plates. The cooling plates can be moved independently from one another upwardly toward the sets 50 and downwardly as indicated by the black double arrow in FIG. 8A. The movement of the cooling plates can be controlled individually from one another by the control unit 232. If a cooling plate is required to cool the set 50 to which it is assigned, the cooling plate is moved upwardly toward the respective set 50 until it makes thermal contact with the base plate 8, thereby establishing a heat flow from the respective set 50 toward the cooling plate.

Figure 8B:
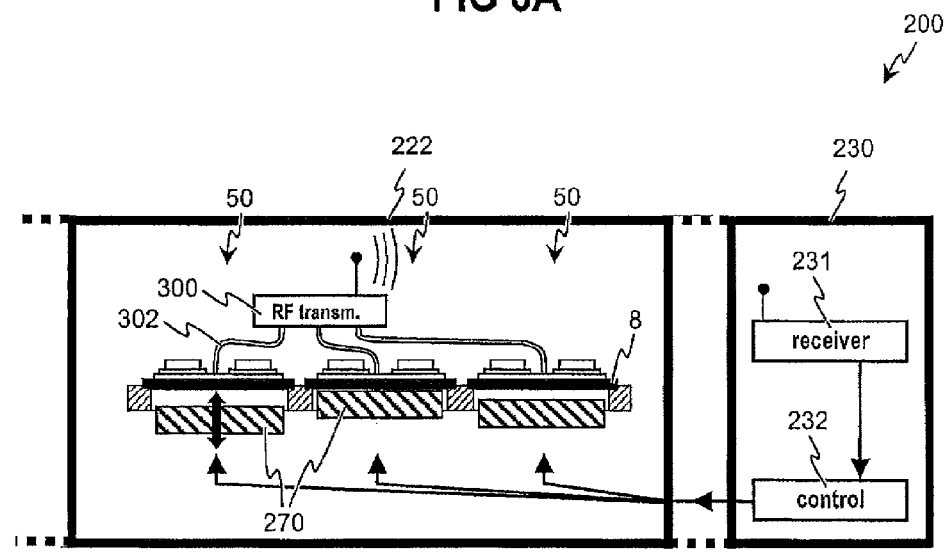
FIG. 8B is a cross-sectional view of a cooling chamber which differs from the cooling chamber of FIG. 8A in that the three sets of components to be soldered are provided with a common radio frequency (RF) transmitter instead of individual radio frequency (RE) transmitters.

The arrangement of FIG. 8B differs from the arrangement of FIG. 8A in that there is a common radio frequency (RF) transmitter 300 which commonly transmits the individual temperature information of each of the sets 50 on the carrier 350 to the receiving unit 231.

Instead of cooling plates, cooling of the sets 50 may take place by one or more controllable streams of a cooling fluid, for instance air or another gas. If there is only one stream of cooling fluid, that stream may affect all sets 50 within the cooling chamber 221, 222. In doing so, the cooling by a single cooling stream can be controlled in the same manner as the heating by the single inductor described with reference to FIGS. 4A and 4B depending on the temperature information about all sets 50 in the cooling chamber 222.

However, it is also possible to provide for each one of the sets 50 in the cooling chamber 221, 222 an individual stream of cooling fluid, i.e. a stream which individually affects one and only one of the sets 50. In doing so, the cooling by individual cooling streams can be controlled in the same manner as the heating by the individual inductors described with reference to FIGS. 5A and 5B depending on the temperature information about all sets 50 in the cooling chamber 222.

If it is required to identify individual sets 50, for instance, if each set 50, after the soldering process has finished, is to be tagged with its individual temporal course of temperature in the soldering machine 200, in an arrangement where to each one of the sets 50 an individual inductor is assigned as described with reference to FIGS. 5A, 5B, 6A, 6B, 7A, 7B, all inductors can subsequently be provided transiently with electric energy so as to generate a significant transient temperature rise in one of the sets 50. By monitoring the temperatures of all sets 50 it is clear that the set 50 exhibiting a significant temperature rise has been heated by the electric energy and therefore can be assigned to the respective inductor.

In repeating that method for all inductors subsequently, sufficiently staggered over time so as to avoid resolution problems, each set 50 can be assigned to another one of the inductors.

If there is unreasonable temperature information transmitted, it can be concluded that there is an error with a temperature sensor or an electrical connection, with a transmission, or that one or more openings did not receive a set 50.

Figure 9:
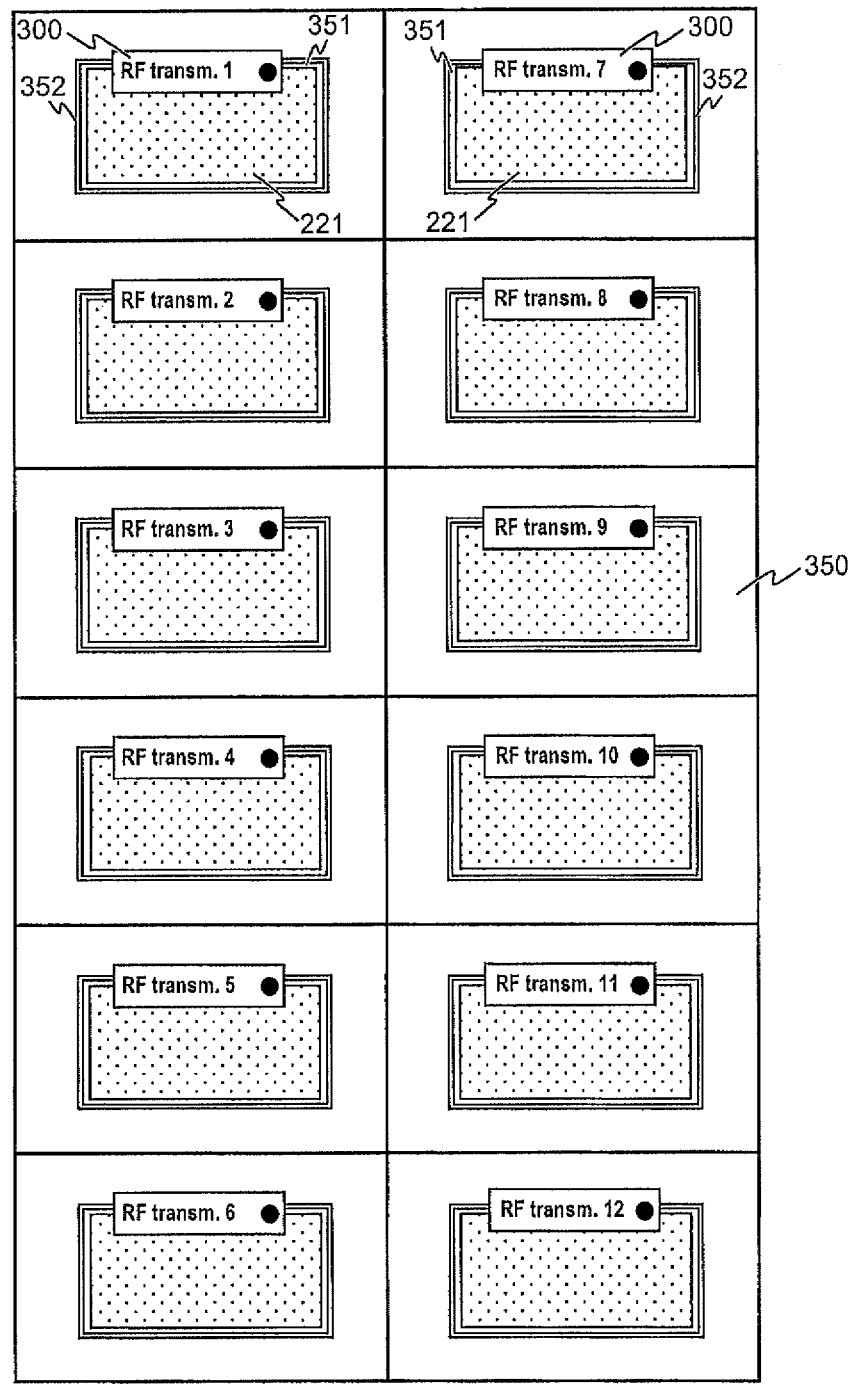
FIG. 9 is a top view of a carrier which is arranged in a cooling chamber and has a number of openings, where each of the openings is designed to receive a set of components to be soldered, and for each of the openings an individual radio frequency (RF) transmitter is provided.

FIG. 9 shows the carrier 350 arranged in a cooling chamber 221. The carrier has a number of openings 351, each opening 351 being designed to receive a set of components to be soldered. An individual radio frequency (RF) transmitter 300 is provided for each of the openings 351.

Figure 10:
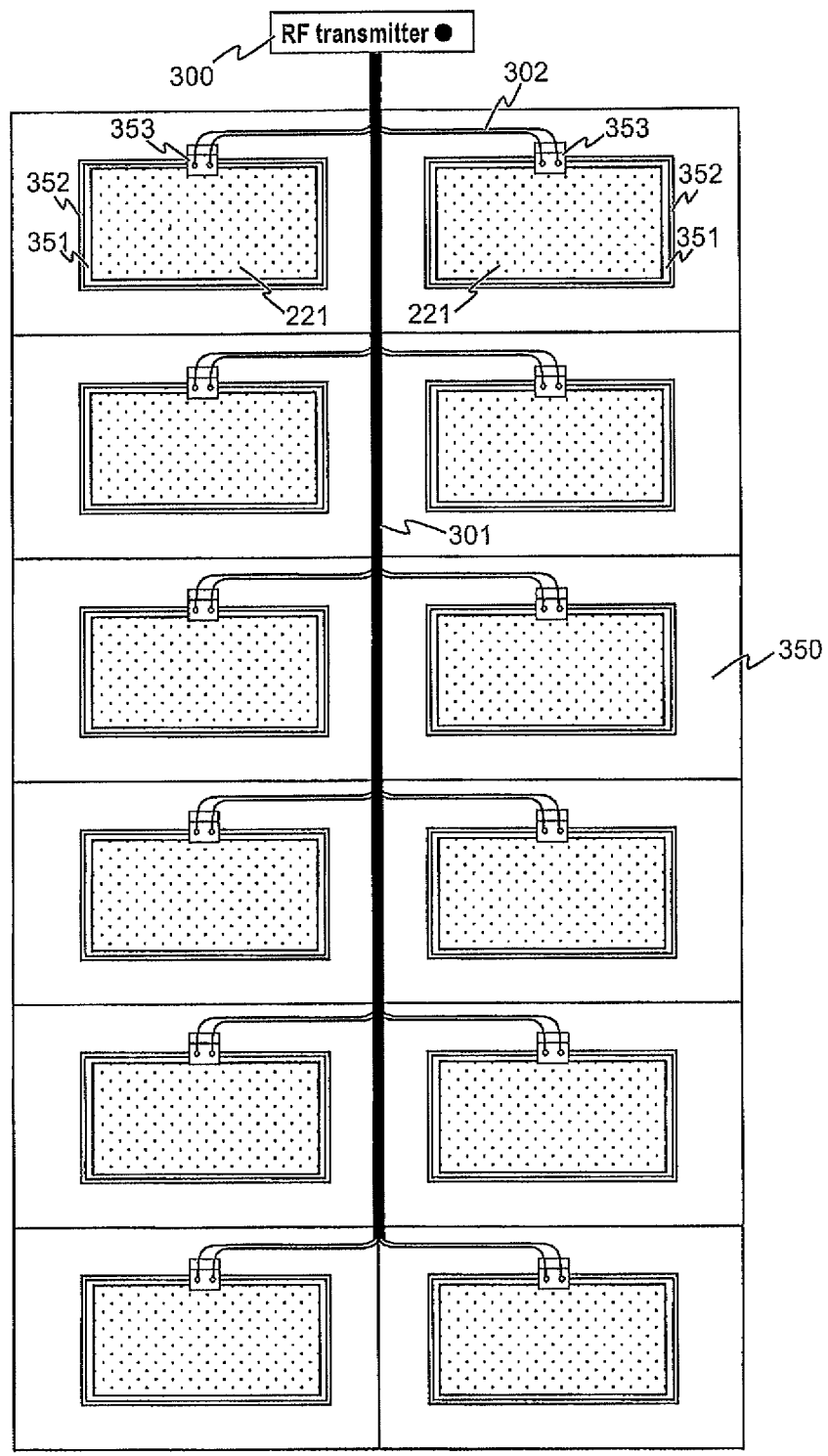
FIG. 10 is a top view of a carrier which differs from the carrier of FIG. 9 in that the sets of components to be soldered are provided with a common radio frequency (RF) transmitter instead of individual radio frequency (RF) transmitters.

FIG. 10 shows a carrier 350 which differs from the carrier of FIG. 9 in that the sets of components to be soldered are provided with a common radio frequency (RF) transmitter 300 instead of individual radio frequency (RF) transmitters.

The described heating and cooling processes can be combined arbitrarily with one another. For instance, referring again to FIG. 2, there may be executed a first heating step in a first heating chamber 211 in order to pre-heat the sets 50 to approximately a first temperature which is lower than the melting point of the solder 23. In a subsequent second heating step carried out with the sets 50 being arranged in a second heating chamber 212, the temperatures of the sets 50 may be increased to approximately a second temperature which is higher than the first temperature but still lower than the melting point of the solder 23. Optionally, the soldering surfaces of the soldering partner may be activated in an atmosphere containing forming gas or formic acid or the like.

Then, in a subsequent third heating step carried out with the sets 50 being arranged in a third heating chamber 213, the temperatures of the sets 50 may be increased to approximately a third temperature which is higher than the melting point of the solder 23 so as to melt the solder 23. Optionally, the third heating step may be carried out at low gas pressure, for instance below 20 hPa, in the third heating chamber 213 so as avoid shrinking holes in the soldered connection.

In a subsequent first cooling step carried out with the sets 50 being arranged in a first cooling chamber 221, the temperatures of the sets 50 may be decreased to a fourth temperature which is lower than the melting point of the solder 23 so as to cure the solder 23.

Then, in a subsequent second cooling step carried out with the sets 50 being arranged in a second cooling chamber 222, the temperatures of the sets 50 may be slowly decreased to a fifth temperature which is lower than the fourth temperature so as to avoid thermo-mechanical stress in the soldered units. The transport of the sets 50 between all chambers 211, 212, 213, 221, 222 of the soldering machine may be carried out with the sets 50 remaining on the same carrier 350 during the whole soldering process.

Figure 11:
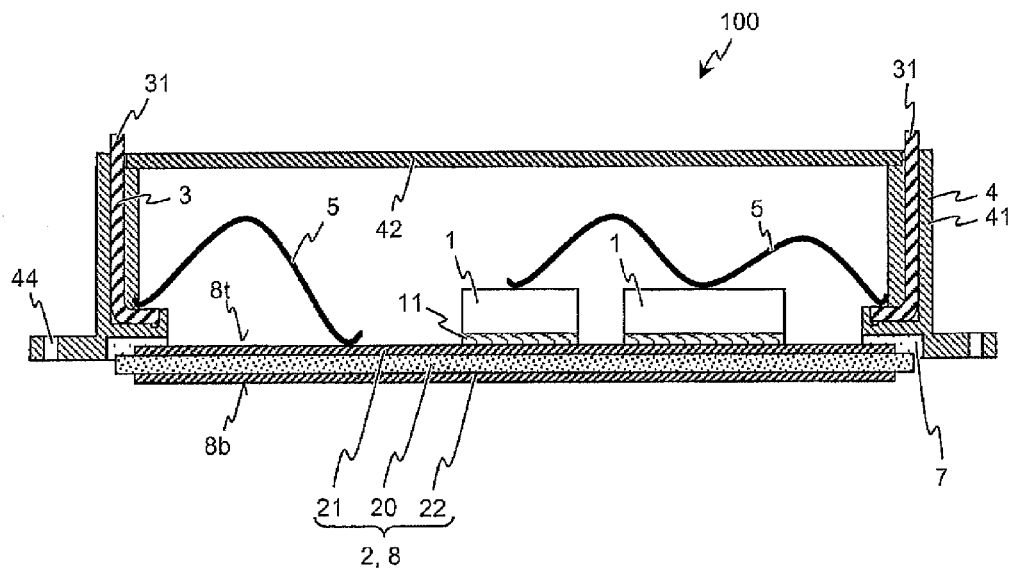
FIG. 11 is a cross-sectional view of another power semiconductor module.

FIG. 11 shows a power semiconductor 100 which differs from the power semiconductor module of FIG. 1A in that instead of a thick metallic base plate 8, the substrate 2 itself forms a base plate of the module 100. The substrate 2 is joined to the module housing 4 by an adhesive 7. The substrate 2 has two or more metallization layers 21, 22 and one or more insulation carriers 20, where between any two of the metallization layers 21, 22 at least one of the insulation carriers 20 is arranged. As the substrate 2 serves as a base plate, the bottommost of the metallization layers 22 of the substrate 2 provides an outer face of the power semiconductor module 100.

Figure 12:
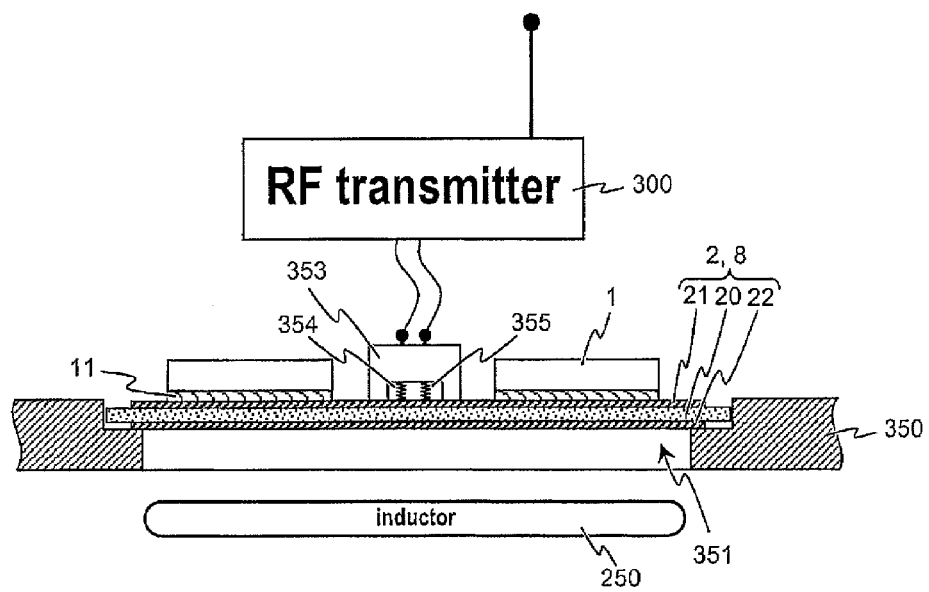
FIG. 12 is a cross-sectional view of a set including a substrate and a power semiconductor chip as soldering partners which is inserted in a carrier and soldered by an inductor.

FIG. 12 is a cross-sectional view of a set that includes two soldering partners during soldering. The first soldering partner is a substrate 2, the second soldering partner is a power semiconductor chip 1. The set is inserted in a carrier 350. Soldering takes place by an inductor 250 which creates eddy currents in particular in the bottommost metallization layer 22 of the substrate 2. Due to these eddy currents, the solder 11 between the substrate 2 and the power semiconductor chips 1 is melted. Except that there is no thick metallic base plate, the process of soldering and subsequent cooling may be accomplished in the same way as described with reference to FIGS. 2 to 10. The unit produced in that soldering process may be used for assembling a power semiconductor module 100 as described with reference to FIG. 1A and for assembling a power semiconductor module 100 as described with reference to FIG. 11 as well.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A soldering method comprising:
providing a soldering machine comprising a heating chamber with an induction heating unit operable to, provide energy and at least one cooling chamber with a cooling unit,
providing at least two sets of components to be soldered, each set comprising a first soldering partner, a second soldering partner, and a solder;
positioning each one of the sets of components with its solder arranged between its first soldering partner and its second soldering partner inside the heating chamber,
providing for each one of at least two of the sets a temperature measuring unit individually assigned to the respective setwhere said temperature measuring unit is positioned inside or on a surface of one of the components in the respective set;
providing a wireless radio frequency transmitter and a wireless radio frequency receiver,
providing a control unit coupled to the wireless radio frequency receiver, the control unit operable to control the induction heating unit;
transmitting for each one of the temperature measuring units temperature information on the temperature of one of the soldering partners of the respective set of components to the wireless radio frequency receiver by the wireless radio frequency transmitter;
heating the sets of components by the energy provided by the induction heating unit;
controlling the energy provided by the induction heating unit via the control unit based on the temperature information;
passing all sets of components, after the solders of all sets have been heated up to at least their respective melting points, from the heating chamber into the cooling chamber; and
cooling the sets of components via the cooling unit by controlling the cooling unit based on the temperature information.

2. The soldering method as claimed in claim 1, wherein the temperature information is continuously monitored during the heating of the sets of components.

3. The soldering method as claimed in claim 1, wherein the induction heating unit is an inductor.

4. The soldering method as claimed in claim 1, wherein a first one of the temperature measuring units comprises an electrically conductive first contact member and an electrically conductive second contact member.

5. The soldering method as claimed in claim 4, wherein:
the electrically conductive first contact member and the electrically conductive second contact member are made of different material;
the first soldering partner or the second soldering partner to which the first temperature measuring unit is assigned is formed as an electrically conductive part or comprises an electrically conductive part;
first contact member and an the second contact member both make direct electrical pressure contact to the electrically conductive part; and
the temperature information depends on a first contact potential difference between the first contact member and the electrically conductive part, and on a second contact potential difference between the second contact member and the electrically conductive part.

6. The soldering method as claimed in claim 4, wherein one of the soldering partners of the set to which the first temperature measuring unit is assigned comprises a temperature measuring element which is directly or indirectly electrically connected by pressure contact to both the first contact member and the second contact member.

7. The soldering method as claimed in claim 1, wherein the induction heating unit is an inductor which provides energy to at least two of the sets of components during the heating of the sets of components.

8. The soldering method as claimed in claim 7, wherein the inductor generates eddy currents in at least one of the soldering partners.

9. The soldering method as claimed in claim 1, wherein a separate wireless radio frequency transmitter is provided for each different set of components.

10. The soldering method as claimed in claim 1, wherein:
the induction heating unit comprises at least two inductors;
each one of the inductors is assigned to a different one of the sets of components; and
each one of the inductors individually provides energy to the set of components to which the respective inductor is assigned during the heating of the sets of components.

11. The soldering method as claimed in claim 10, wherein each inductor generates eddy currents in at least one of the soldering partners of the set of components to which the respective inductor is assigned.

12. The soldering method as claimed in claim 1, wherein:
at least two wireless radio frequency transmitters are provided;
each wireless radio frequency transmitter is assigned to a different one of the sets of components; and
each wireless radio frequency transmitter is operable to transmit temperature information on the temperature of the set of components to which the respective wireless radio frequency transmitter is assigned but not on the temperature on another one of the sets.

13. The soldering method as claimed in claim 1, wherein:
the induction heating unit comprises at least two inductors;
each inductor is assigned to a different one of the sets of components;
each inductor is operable to individually provide energy to the set of components to which the respective inductor is assigned during the heating of the sets of components;
at least two wireless radio frequency transmitters are provided;
each wireless radio frequency transmitter is assigned to a different one of the sets of components;
each wireless radiofrequency transmitter is operable to transmit temperature information on the temperature of the set of components to which the respective wireless radiofrequency transmitter is assigned but not on the temperature on another one of the sets;
the method further comprising the following sequence of steps:

(a) transiently increasing the energy provided by one and only one of the inductors so as to individually heat up the set of components to which that inductor is assigned;

(b) comparing the temperature information transmitted by each wireless radiofrequency transmitter and identifying the temperature information of which shows a maximum increase in temperature; and (c) assigning the wireless radio frequency transmitter associated with the maximum increase in temperature to the inductor for which the energy is transiently increased.

14. The soldering method as claimed in claim 13, wherein the step sequence is successively repeated for each one of the inductors.

15. The soldering method as claimed in claim 1, wherein the temperature information is continuously monitored while all sets of components are passed from the heating chamber into the cooling chamber.

16. The soldering method as claimed in claim 1, wherein the temperature information is continuously monitored during the cooling of the sets of components.

17. The soldering method as claimed in claim 1, wherein the cooling unit is operable to provide a cooling air stream affecting at least two of the sets of components.

18. The soldering method as claimed in claim 1, wherein the cooling unit is operable to provide at least two cooling air streams, each air stream being assigned to a different one of the sets of components, and each air streams individually cooling the set of components to which the respective cooling stream is assigned.

19. The soldering method as claimed in claim 1, wherein the cooling unit comprises at least two cooling plates, each cooling plate is assigned to a different one of the sets of components, and each cooling plate individually cools the set of components to which the respective cooling plate is assigned by thermally contacting that set.

20. The soldering method as claimed in claim 1, wherein the first soldering partner of each one of the sets of components is a metal plate.

21. The soldering method as claimed in claim 1, wherein the second soldering partner of each one of the sets of components comprises an insulation substrate.

22. The soldering method as claimed in claim 20, wherein the second soldering partner of each one of the sets comprises a semiconductor chip joined to the substrate prior to the heating of the sets of components.

23. The soldering method as claimed in claim 1, wherein:
the solder of each of the sets of components is melted and subsequently solidified so as to form a soldered connection between the first soldering partner and the second soldering partner; and
after the solder of each of the sets is melted and prior to the solidification of the solder of each of the sets, the melted solder of each of the sets is exposed to a reducing atmosphere at a pressure of less than or equal to 20 hPa.

24. A soldering method comprising:
providing a soldering machine comprising a heating chamber with an induction heating unit operable to provide energy;
providing at least two sets of components to be soldered, each set comprising a first soldering partner, a second soldering partner, and a solder;
positioning each one of the sets of components with its solder arranged between its first soldering partner and its second soldering partner inside the heating chamber,
providing for each one of at least two of the sets a temperature measuring unit individually assigned to the respective set where said temperature measuring unit is positioned inside or on a surface of one of the components in the respective set;
providing a wireless radio frequency transmitter and a wireless radio frequency receiver,
providing a control unit coupled to the wireless radio frequency receiver, the control unit operable to control the induction heating unit;
transmitting for each one of the temperature measuring units temperature information on the temperature of one of the soldering partners of the respective set of components to the wireless radio frequency receiver by the wireless radio frequency transmitter,
heating the sets of components by the energy provided by the induction heating unit; and
controlling the energy provided by the induction heating unit via the control unit based on the temperature information;
wherein the induction heating unit comprises at least two inductors, each inductor is assigned to only one set of components, each inductor is operable to individually provide energy to the one set of components to which the respective inductor is assigned during the heating of the sets of components.

* * * * *

UNITED STATES PATENT AND TRADEMARK OFFICE
CERTIFICATE OF CORRECTION

PATENT NO.        : 8,941,035 B2
APPLICATION NO.   : 13/077163
DATED             : January 27, 2015
INVENTOR(S)       : G. Strotmann et al.

It is certified that error appears in the above-identified patent and that said Letters Patent is hereby corrected as shown below:

In the Claims,
Column 11, line 17 (claim 1, line 3) please change "to, provide" to -- to provide --
Column 11, line 25 (claim 1, line 11) please change "chamber," to -- chamber; --
Column 11, line 28 (claim 1, line 14) please change "setwhere said" to -- set where said --
Column 11, line 32 (claim 1, line 18) please change "receiver," to -- receiver; --
Column 12, line 3 (claim 5, line 9) please change "and an the" to -- and the --
Column 14, line 21 (claim 24, line 13) please change "setwhere said" to -- set where said --
Column 14, line 33 (claim 24, line 25) please change "transmitter," to -- transmitter; --

Signed and Sealed this
Second Day of June, 2015

Michelle K. Lee
*Director of the United States Patent and Trademark Office*